(12) United States Patent
Nishio et al.

(10) Patent No.: US 7,163,407 B2
(45) Date of Patent: *Jan. 16, 2007

(54) MODULE CONNECTOR

(75) Inventors: Atsushi Nishio, Ibaraki (JP); Takashi Kawasaki, Ibaraki (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/445,149

(22) Filed: Jun. 2, 2006

(65) Prior Publication Data

US 2006/0246751 A1     Nov. 2, 2006

Related U.S. Application Data

(63) Continuation of application No. 10/629,570, filed on Jul. 30, 2003, now Pat. No. 7,077,663.

(30) Foreign Application Priority Data

Jul. 31, 2002   (JP) ................... P. 2002-222942

(51) Int. Cl.
*H01R 12/00* (2006.01)
(52) U.S. Cl. ........................................ 439/70
(58) Field of Classification Search ........... 439/525, 439/68, 69, 71, 72
See application file for complete search history.

(56) References Cited

U.S. PATENT DOCUMENTS

| 3,701,077 | A | 10/1972 | Kelly, Jr. |
| 4,378,139 | A | 3/1983 | Griffin et al. |
| 4,645,279 | A | 2/1987 | Grabbe et al. |
| 4,934,944 | A | 6/1990 | Kozel et al. |
| 5,055,972 | A | 10/1991 | Atoh |
| 5,226,824 | A | 7/1993 | Karlovich et al. |
| 5,289,034 | A | 2/1994 | Hundt |
| 5,360,353 | A | 11/1994 | Kinoshita |
| 6,268,882 | B1 | 7/2001 | Elberbaum |
| 6,328,574 | B1 | 12/2001 | Howell et al. |
| 6,421,250 | B1 | 7/2002 | Kim et al. |
| 6,435,882 | B1 | 8/2002 | Pitou |

*Primary Examiner*—Briggitte R. Hammond
(74) *Attorney, Agent, or Firm*—Whitham, Curtis, Christofferson & Cook, P.C.

(57) ABSTRACT

A connector has an inner side face defining a chamber formed with an opening. A module body is inserted from the opening to be accommodated in the chamber. A first conductive member is provided on an outer periphery of the module body which is opposed to the inner side face of the connector in a case where the module body is accommodated in the chamber. A second conductive member is provided on the inner side face of the connector, such that the first conductive member is brought into contact with the first conductive member in a case where the module body is plenarily accommodated in the chamber.

10 Claims, 6 Drawing Sheets

MODULE CONNECTOR

CROSS-REFERENCE TO RELATED APPLICATIONS

This application is a continuation application of U.S. Ser. No. 10/629,570, filed Jul. 30, 2003, now U.S. Pat. No. 7,077,663 the complete contents of which is incorporated by reference.

BACKGROUND OF THE INVENTION

This invention relates to a connector to which a module such as a memory module and a camera module is fitted.

FIGS. 4A to 4C show a first related-art camera module 1 to be mounted on a cellular mobile phone or the like, and this camera module 1 comprises a module body 2, and a lens portion 3 formed on an upper side of the module body 2. Two (left and right) rows of contact pads 4 and 5 are formed on a bottom face of the module body 2.

FIGS. 5A to 5D show a related-art connector 6 to which the camera module 1 is fitted. The connector 6 is formed into a square box-like body having an upwardly-open chamber 6a. Two (left and right) rows of parallel grooves 7 and 8 are formed in an upper face of a bottom 6b of the chamber 6a, so that the left grooves 7 extend from a central portion of the bottom 6b to an inner left side wall of the chamber 6a, and the right grooves 8 extend from the central portion of the bottom 6b to an inner right side wall of the chamber 6a. A row of left contact pins 9 are provided in the left grooves 7, respectively, while a row of right contact pins 10 are provided in the right grooves 8, respectively.

As shown in FIG. 5D, an inner end portion of each of the left row of contact pins 9 is bent upwardly to project from an associated groove 7 to form a contact projection 9a for contact with an associated contact pad 4 of the camera module 1. Each contact pin 9 extends left, and passes through the connector 6 to project to the exterior, and an outer end portion of the contact pin 9 is bent to form a terminal 9b for contact with a wiring board (not shown) on which the connector 6 is mounted.

Similarly, an inner end portion of each of the right row of contact pins 10 is bent upwardly to project from an associated groove 8 to form a contact projection 10a for contact with an associated contact pad 5 of the camera module 1. Each contact pin 10 extends right, and passes through the connector 6 to project to the exterior, and an outer end portion of the contact pin 10 is bent to form a terminal 10b for contact with the wiring board.

When the contact projections 9a and 10a of the contact pins 9 and 10 are pressed down respectively by the contact pads 4 and 5 of the camera module 1 from the upper side, the contact pins 9 and 10 are bent as indicated in phantom lines in FIG. 5D, so that the distal ends (inner ends) of the contact pins 9 and 10 abut against the bottom of the grooves 7 and 8. The contact pins 9 and 10 are accordingly held in firm press-contact respectively with the contact pads 4 and 5 because of reaction forces of these contact pins.

When the camera module 1 is inserted into the chamber 6a of the connector 6 from the upper side of this connector 6, the contact pads 4 and 5 of the camera module 1 are press-contacted respectively with the contact projections 9a and 10a of the connector pins 9 and 10 of the connector 6, as shown in FIG. 6.

Signals of the camera module 1 are transmitted to the contact pins 9 and 10 via the contact pads 4 and 5 and the contact projections 9a and 10a, and further are transmitted to a circuit (not shown) of the wiring board via the terminals 9b and 10b.

FIGS. 7A to 7D show a second related-art camera module 11. This camera module 11 comprises a module body 12, and a lens portion 13 formed on an upper side of the module body 12. A projection 14 is extended horizontally from one side face of the module body 12. A plurality of parallel contacts 15 are provided on an upper face of the projection 14, while a plurality of parallel contacts 16 are provided on a lower face of the projection 14.

FIGS. 8A to 8D show a connector 17 to which the camera module 11 is attached. This connector 17 is formed into a box-like body having an open chamber 17a. A central portion of a left half portion of the upper side of this connector is open, and a row of upper contact pins 18 and a row of lower contact pins 19 for gripping the contact portions 15 and 16 (provided on the projection 14 of the module body 12) are provided at an inner bottom portion of the connector 17 disposed on the right side of the chamber 17a. An inner end portion of each of the contact pins 18, disposed near to the central portion of the connector 17, is bent to form a contact projection 18a for contact with the associated contact portion 15 of the module body 12, and an inner end portion of each of the contact pins 19, disposed near to the central portion of the connector 17, is bent to form a contact projection 19a for contact with the associated contact portion 16 of the module body 12. The contact pins 18 and 19 extend so as to pass through the connector 17 to project to the exterior, so that an outer end portion of each contact pin 18 is bent to form a terminal portion 18b for contact with a wiring board (not shown) on which the connector 17 is mounted, and an outer end portion of each contact pin 19 is bent to form a terminal portion 19b for contact with the wiring board.

When the camera module 11 is inserted into the chamber 17a of the connector 17 through the left side opening thereof, the projection 14 of the camera module 11 is held between the contact pins 18 and the contact pins 19 in such a manner that the contact portions 15 and 16 are held in press-contact with the contact projections 18a and 19a of the contact pins 18 and 19, respectively. Thus, the camera module 11 is attached to the connector 17 as shown in FIG. 9.

However, when the camera module 1 is attached to the connector 6 as shown in FIG. 6, the bottom face of the camera module 1 is spaced a predetermined distance from the wiring board since the contact pins 9 and 10 and the bottom wall 6b of the connector 6 exist between the bottom face of the camera module 1 and the wiring board. With this construction, the connector 6 has an increased height H1, and also an overall height H2, obtained when attaching the camera module 1 to the connector 6, is increased, and these are causes of the failure to achieve a thinner design of the connector 6 and a thinner design of the structure obtained by attaching the camera module 1 to the connector 6.

When the camera module 11 is attached to the connector 17 as shown in FIG. 9, a height H3 of the connector 17 is hardly increased, and also an overall height H4, obtained when attaching the camera module 11 to the connector 17, is hardly increased, and therefore a thinner design can be achieved. However, the camera module 11 has the projection 14 formed on the side face thereof, and therefore a width L1 of the camera module 11 is increased, and also the connector 17 has an increased width L2 since the connector 17 includes the portion for receiving the body portion 12 of the camera module 11 and the portion for contact with the projection 14.

And besides, a width of the overall structure, obtained by attaching the camera module 11 to the connector 17, has the dimension L2. Therefore, there is encountered a problem that a space-saving design can not be achieved.

SUMMARY OF THE INVENTION

It is therefore an object of the invention to provide a module connector which able to achieve a thinner and a space-saving design.

In order to achieve the above object, according to the invention, there is provided a connection structure, comprising:

a connector, having an inner side face defining a chamber formed with an opening;

a module body, inserted from the opening to be accommodated in the chamber;

a first conductive member, provided on an outer periphery of the module body which is opposed to the inner side face of the connector in a case where the module body is accommodated in the chamber; and a second conductive member, provided on the inner side face of the connector, such that the first conductive member is brought into contact with the second conductive member in a case where the module body is plenarily accommodated in the chamber.

With such a configuration, as compared with the related-art construction in which the conducive member of the connector is so arranged as to face the lower side of the module body, the height of the connector can be made smaller, and also the height of the overall structure, obtained by attaching the module body to the connector, can be made smaller, thereby achieving the thinner design. Further, the width of the connector can be made smaller, and the space-saving design can be achieved.

Furthermore, the force, exerted in the direction of insertion of the module body, is not applied directly to the second conductive member, there is achieved an advantage that the contact pins will not be damaged.

Preferably, the second conductive member is extended in a direction parallel to an inserting direction of the module body.

Preferably, the module body is a memory module or a camera module.

Preferably, an end of the chamber opposite to the opening is made open.

With such a configuration, a bottom wall of the chamber as provided in the related-art construction is not provided at the end of the chamber, so that the thickness of the connector can be further reduced.

Preferably, at least a pair of the second conductive member is arranged on the inner side face of the connector so as to oppose to each other.

Here, it is preferable that the second conductive member has elasticity.

With such a configuration, since the second conductive members are pressed against the module body in a gripping manner, the stable contact can be obtained.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE INVENTION

Figure 1A:
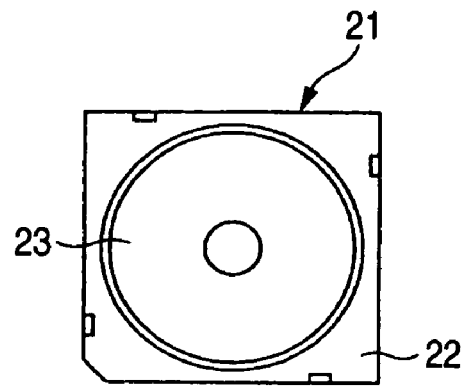
FIG. 1A is a top plan view of a camera module according to one embodiment of the invention.
Figure 1B:
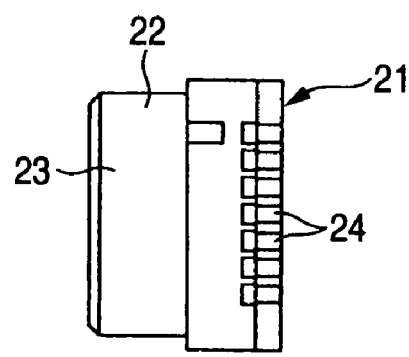
FIG. 1B is a side view of the camera module.
Figure 1C:
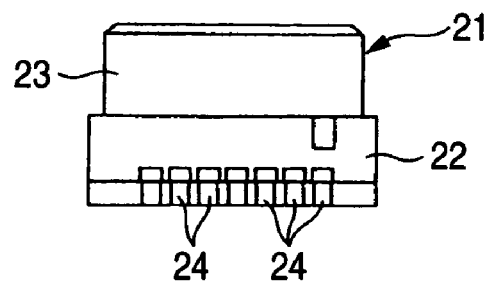
FIG. 1C is a partly sectional front view of the camera module.
Figure 1D:
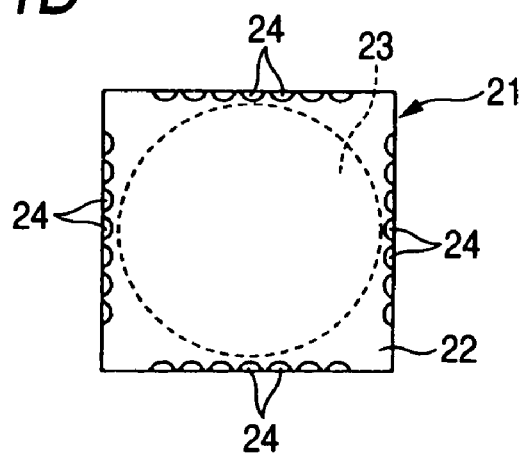
FIG. 1D is a bottom plan view of the camera module.
Figure 2A:
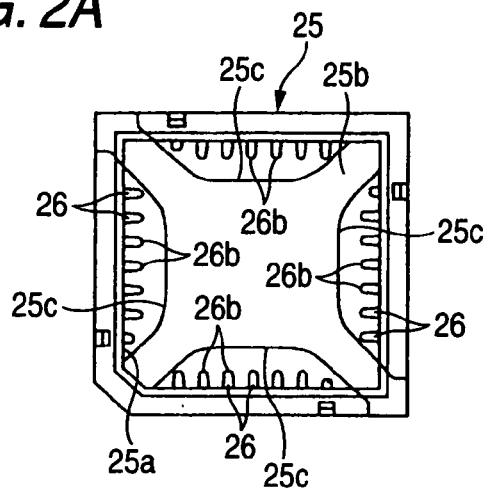
FIG. 2A is a top plan view of a connector according to one embodiment of the invention.
Figure 2B:
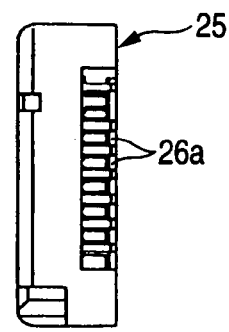
FIG. 2B is a side view of the connector.
Figure 2C:
FIG. 2C is a front view of the connector.
Figure 2D:
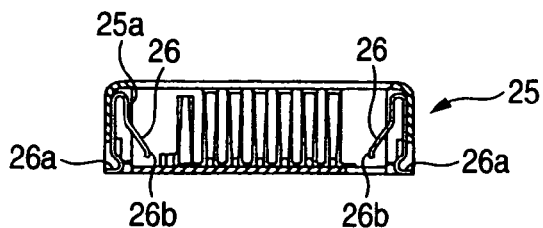
FIG. 2D is a sectional front view of the connector.

One preferred embodiment of the present invention will now be described in detail with reference to the accompanying drawings.

FIGS. 1A to 1D show a camera module 21 mounted on a cellular mobile phone or the like, and this camera module 21 comprises a module body 22, and a lens portion 23 formed on an upper side of the module body 22. A plurality of parallel contact pads 24 is formed at a lower half portion of each of four side faces of the module body 22, and extend vertically.

FIGS. 2A to 2D show a connector 25 to which the camera module 21 is fitted. This connector 25 is formed into a square box-like body having an upwardly-opened chamber 25a. Four side portions of a bottom 25b of the chamber 25a are suitably notched to form openings 25c, and a plurality of parallel contact pins 26 are provided on an inner side wall of the chamber 25a, and extend vertically.

Although the connector 25 has the bottom 25b, this bottom 25b may be removed so as to provide the chamber 25a having an open top and an open bottom. In this case, the connector 25 is reduced in thickness by an amount corresponding to the thickness of this removed bottom wall 25b.

Each of the contact pins 26 is bent into a generally inverted V-shape, and is fixedly secured to the inner side face of the chamber 25a. One end portion of the contact pin 26 is formed into a terminal 26a which is exposed to the lower side of the connector 25 through the associated opening 25c, and is bent outwardly horizontally so as to be electrically connected with a circuit (not shown) formed on a wiring board (not shown) on which the connector 25 is mounted. The other end portion of the contact pin 26 is bent to project inwardly to form a contact projection 26b for contact with the associated contact pad 24 of the module body 22.

Figure 3:
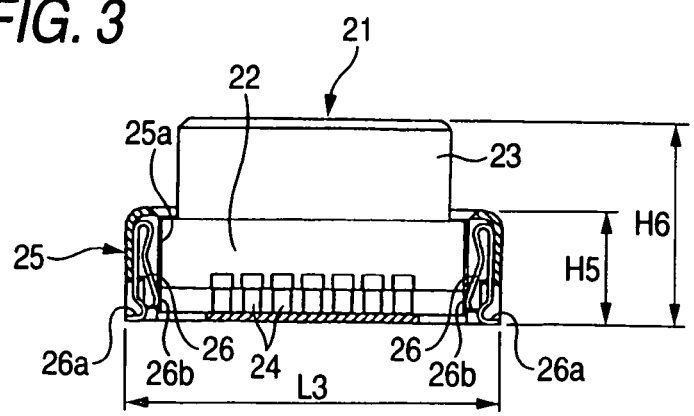
FIG. 3 is a partly sectional front view showing a state that the camera module is fitted with the connector.
Figure 4A:
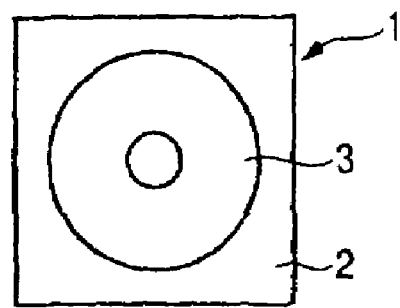
FIG. 4A is a top plan view of a first related-art camera module.
Figure 4B:
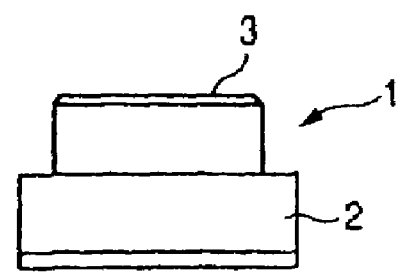
FIG. 4B is a side view of the first related-art camera module.
Figure 4C:
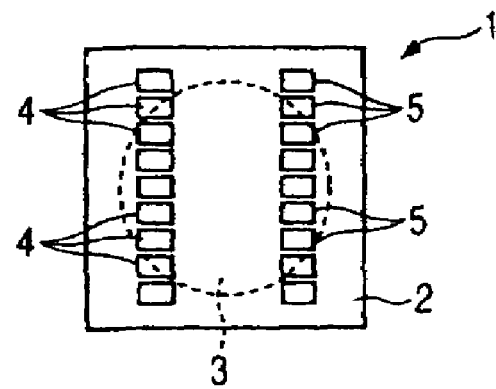
FIG. 4C is a bottom plan view of the first related-art camera module.
Figure 5A:
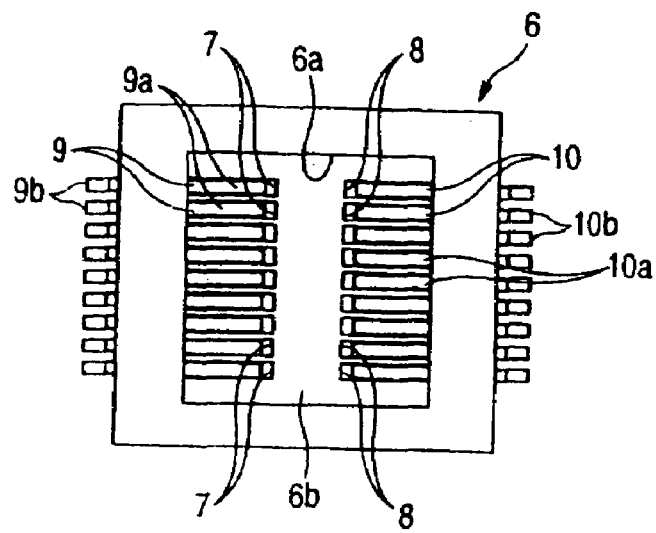
FIG. 5A is a top plan view of a first related-art connector.
Figure 5B:
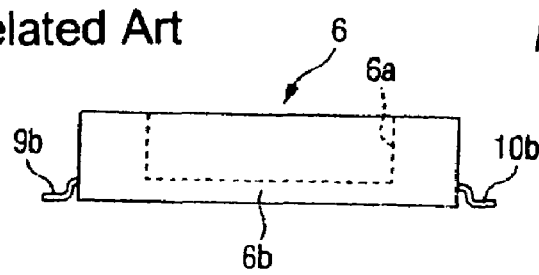
FIG. 5B is a front view of the first related-art connector.
Figure 5C:
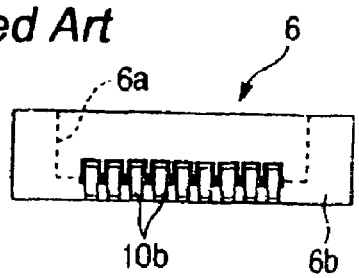
FIG. 5C is a side view of the first related-art connector.
Figure 5D:
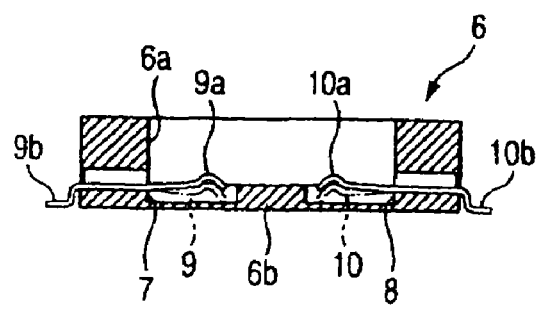
FIG. 5D is a sectional front view of the first related-art connector.

When the camera module 21 is inserted into the chamber 25a from the upper side of this connector 25, the contact pads 24 are brought into press-contact with the contact projections 26b of the contact pins 26. The attachment of the camera module 21 to the connector 25 is thus completed as shown in FIG. 3.

Signals of the camera module 21 are transmitted from the contact pads 24 to the contact pins 26 via the contact projections 26b, and further are transmitted to the circuit of the wiring board via the terminals 26a.

Figure 6:
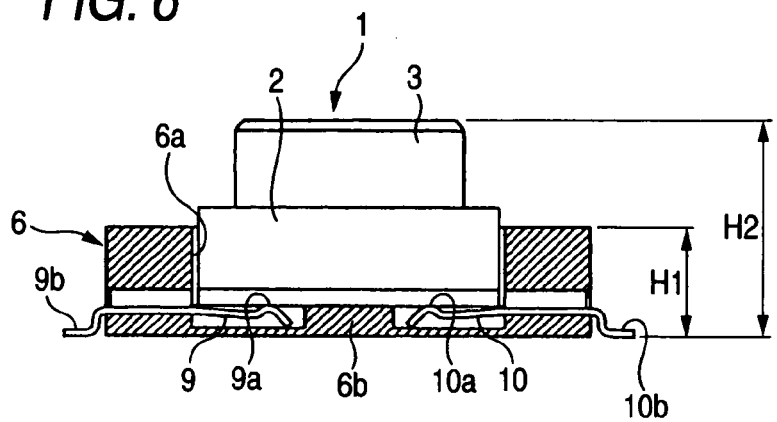
FIG. 6 is a partly sectional front view showing a state that the first related-art camera module is fitted with the related-art connector.
Figure 7A:
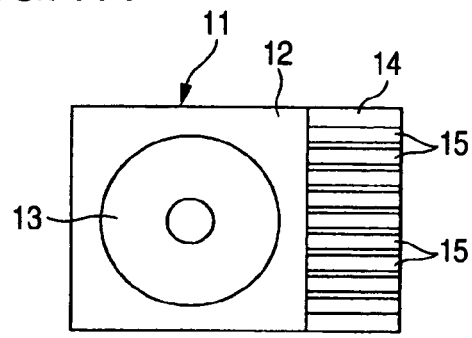
FIG. 7A is a top plan view of a second related-art camera module.
Figure 7B:
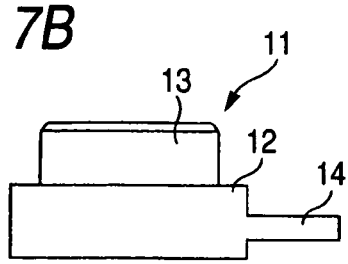
FIG. 7B is a front view of the second related-art connector.
Figure 7C:
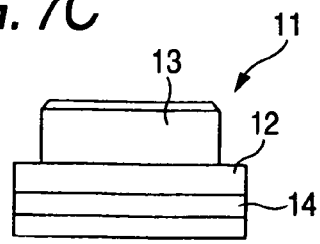
FIG. 7C is a side view of the second related-art camera module.
Figure 7D:
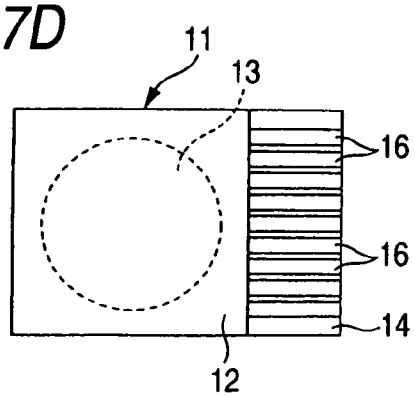
FIG. 7D is a bottom plan view of the second related-art camera module.
Figure 8A:
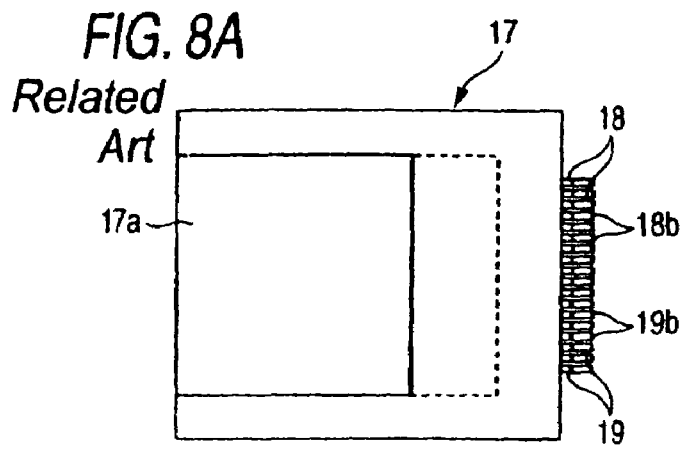
FIG. 8A is a top plan view of a second related-art connector.
Figure 8B:
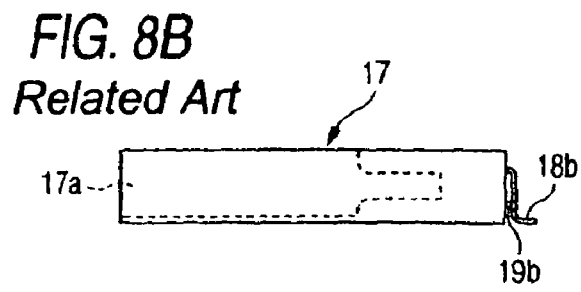
FIG. 8B is a front view of the second related-art connector.
Figure 8C:
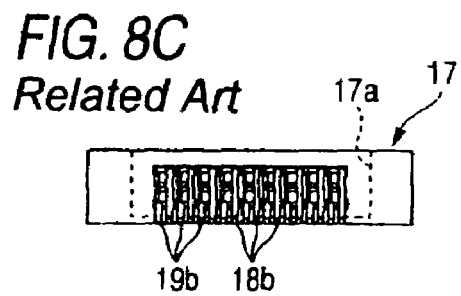
FIG. 8C is a side view of the second related-art connector.
Figure 8D:
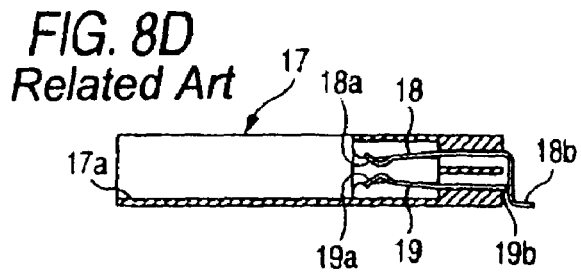
FIG. 8D is a sectional front view of the second related-art connector.
Figure 9:
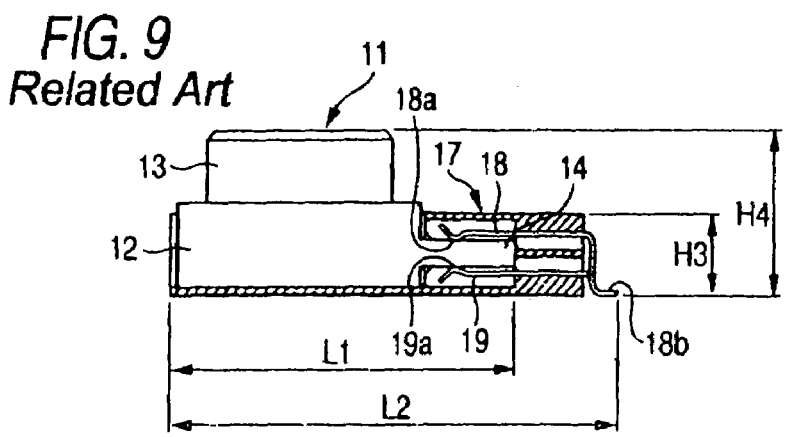
FIG. 9 is a partly sectional front view showing a state that the second related-art camera module is fitted with the related-art connector.

As described above, since the contact pins 26 are provided on the inner side face of the connector 25, as compared with the first related-art connector shown in FIG. 6, a height H5 of the connector 25 can be made smaller, and also a height H6 of the overall structure, obtained by attaching the camera module 21 to the connector 25, can be made smaller, thereby achieving a thinner design. Further, a width L3 of the connector can be made smaller as compared with the second related-art connector shown in FIG. 9, thereby achieving a space-saving design.

Since the contact pins 26 of the connector 25 are pressed against the contact pads 24 of the camera module 21, respectively, in a gripping manner, the stable contact can be obtained. Furthermore, since a force, exerted in the direction of insertion of the camera module 21, is not applied directly to the contact pins 26, there is achieved an advantage that the contact pins 26 will not be damaged.

In the present invention, various modifications can be made without departing from the spirits of the invention, and such modifications fall within the scope of the invention.

Although the connector 25 is so designed as to attach the camera module 21 thereto, the connector of the invention is not limited to the type for attaching the camera module thereto, but the invention can be applied to connectors for attaching various modules (such for example as a memory module) or electric parts thereto.

What is claimed is:

1. A connection structure, comprising:
   a connector, having an inner side face defining a chamber formed with an opening, in which a module body is inserted in a first direction;
   the module body, inserted from the opening to be accommodated in the chamber;
   a first conductive member on the module body; and
   a second conductive member, comprising a plurality of parallel contact pins provided on the inner side face of the connector, such that the first conductive member is brought into contact with the second conductive member in a case where the module body is plenarily accommodated in the chamber, and wherein the second conductive member is extended from the inner side face to an outer side face of the connector so as to be connected to an external line at the outer side face,
   wherein each of the parallel contact pins is bent from a second direction opposed to the first direction to the first direction at a first point, and extended from the first point and bent so as to extend into the chamber at a second point, and extended from the second point to an edge portion to be brought into contact with the first conductive member.

2. The connection structure as set forth in claim 1, wherein the module body is a memory module.

3. The connection structure as set forth in claim 1, wherein the module body is a camera module.

4. The connection structure as set forth in claim 1, wherein an end of the chamber opposite to the opening is made open.

5. The connection structure as set forth in claim 1 wherein said opening is square in shape.

6. The connection structure as set forth in claim 1 wherein each of the parallel contact pins comprises:
   a first end portion which serves as a terminal and is exposed to a lower side of the connector through an associated opening and is bent outwardly horizontally so as to be electrically connected with a circuit formed on a wiring board on which the connector is mounted; and
   a second end portion which is bent to project inwardly to form a contact with an associated contact pad on the module body.

7. The connection structure of claim 1 wherein said plurality of contact pins are fully located within said connector.

8. The connection structure of claim 1 wherein said connector has a second opening positioned below said opening in which said module body is inserted.

9. The connection structure as set forth in claim 1, wherein at least a pair of the second conductive member is arranged on the inner side face of the connector so as to oppose to each other.

10. The connection structure as set forth in claim 9, wherein the second conductive member has elasticity.

* * * * *